(12) United States Patent
Choi et al.

(10) Patent No.: US 11,581,964 B2
(45) Date of Patent: Feb. 14, 2023

(54) COMMUNICATION APPARATUS FOR SUPPORTING ENVELOPE TRACKING MODULATION AND ENVELOPE DELAY OPTIMIZATION METHOD

(71) Applicant: SAMSUNG ELECTRONICS CO., LTD., Suwon-si (KR)

(72) Inventors: Hongmin Choi, Seoul (KR); Haedong Yeon, Hwaseong-si (KR); Junse Lee, Seoul (KR); Heesang Noh, Suwon-si (KR); Changhyun Baek, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/185,498

(22) Filed: Feb. 25, 2021

(65) Prior Publication Data
US 2022/0014287 A1    Jan. 13, 2022

(30) Foreign Application Priority Data
Jul. 7, 2020    (KR) .................. 10-2020-0083606

(51) Int. Cl.
*H04B 17/364*    (2015.01)
*H04B 17/354*    (2015.01)
*H04B 17/13*    (2015.01)

(52) U.S. Cl.
CPC .......... *H04B 17/364* (2015.01); *H04B 17/13* (2015.01); *H04B 17/354* (2015.01)

(58) Field of Classification Search
CPC .... H04B 17/364; H04B 17/13; H04B 17/354; H04B 2001/0408; H03F 2200/451; H03F 2200/102; H03F 1/0211; H03F 3/189
See application file for complete search history.

(56) References Cited

U.S. PATENT DOCUMENTS 8,873,677 B1    10/2014  Loh et al.
8,982,995 B1*   3/2015   Van Cai ............... H04B 1/0475
                                                   375/297
(Continued)

FOREIGN PATENT DOCUMENTS

GB    2505471 A       3/2014
JP    2018-26868 A    2/2018
(Continued)

OTHER PUBLICATIONS

WP509 (v1.0), "Understanding Key Parameters for RF-Sampling Data Converters", White Paper, Xilinx, Feb. 20, 2019 (Year: 2019).*
(Continued)

*Primary Examiner* — Aristocratis Fotakis
(74) *Attorney, Agent, or Firm* — Sughrue Mion, PLLC

(57) ABSTRACT

A method is provided. The method includes estimating adjacent channel leakage ratios respectively corresponding based on a test output signal output from a power amplifier according to a test input signal corresponding to a plurality of frequencies; selecting a test delay value corresponding to a largest value among the estimated adjacent channel leakage ratios; and providing a supply voltage to the power amplifier based on an envelope signal delayed according to the selected test delay value. For each of the plurality of test delay values, a corresponding adjacent channel leakage ratio is estimated based on a ratio of a magnitude of a component included in the test output signal and a magnitude of an inter-modulated component.

20 Claims, 12 Drawing Sheets

(56) References Cited

U.S. PATENT DOCUMENTS

| | | | |
|---|---|---|---|
| 8,989,682 B2 | 3/2015 | Ripley et al. | |
| 9,066,368 B2 | 6/2015 | Lorenz et al. | |
| 9,209,915 B2 | 12/2015 | Kobayashi et al. | |
| 9,729,108 B2 | 8/2017 | Jang et al. | |
| 9,876,472 B2 | 1/2018 | Lee et al. | |
| 10,038,412 B2 | 7/2018 | Huang et al. | |
| 11,036,262 B1* | 6/2021 | Ichitsubo | H03G 3/3042 |
| 2004/0212428 A1* | 10/2004 | Ode | H03F 1/3247 |
| | | | 330/149 |
| 2005/0069026 A1 | 3/2005 | Vepsalainen et al. | |
| 2013/0107926 A1* | 5/2013 | Xia | H03F 1/0255 |
| | | | 455/115.1 |
| 2013/0183915 A1* | 7/2013 | Bai | H03F 1/3294 |
| | | | 455/114.3 |
| 2014/0009225 A1* | 1/2014 | Laporte | H04B 1/0475 |
| | | | 330/103 |
| 2015/0099564 A1* | 4/2015 | Shih | H04W 52/0209 |
| | | | 455/574 |
| 2016/0142229 A1* | 5/2016 | Bevan | H04B 17/0085 |
| | | | 455/307 |
| 2016/0373142 A1* | 12/2016 | Chen | H03F 1/0216 |
| 2017/0093347 A1* | 3/2017 | Zhu | H03F 1/3241 |
| 2020/0106392 A1* | 4/2020 | Khlat | H03F 1/0227 |
| 2020/0119755 A1* | 4/2020 | Mahmood | H04B 1/0475 |
| 2020/0169436 A1* | 5/2020 | Kim | H03F 1/3247 |

FOREIGN PATENT DOCUMENTS

| | | |
|---|---|---|
| JP | 6497640 B2 | 4/2019 |
| KR | 10-2017-0108241 A | 9/2017 |

OTHER PUBLICATIONS

Communication dated Aug. 19, 2021, issued by the European Patent Office in counterpart European Application No. 21159554.1.

* cited by examiner

COMMUNICATION APPARATUS FOR SUPPORTING ENVELOPE TRACKING MODULATION AND ENVELOPE DELAY OPTIMIZATION METHOD

CROSS-REFERENCE TO RELATED APPLICATION

This application claims priority from Korean Patent Application No. 10-2020-0083606, filed on Jul. 7, 2020, in the Korean Intellectual Property Office, the disclosure of which is herein incorporated by reference in its entirety.

BACKGROUND

Methods, apparatuses and systems consistent with example embodiments relate to a communication device and an envelope delay optimization method, and more particularly, to a communication device that supports envelope tracking modulation and a method of optimizing an envelope delay.

In recent years, intensive efforts have been made to improve efficiency of a transmission device provided in user equipment (UE) in order to extend the battery life. In addition, in order to reduce heat loss, the area of network equipment has also been intensively studied. Various technologies have been developed under the assumption that the efficiency and radio frequency (RF) performance of most transmission devices are influenced by a power amplifier (PA).

that has been attracting attention and being constantly studied is envelope tracking (ET).

SUMMARY

Example embodiments provide a method and a device for matching the phase of an input signal and an envelope, and increasing the efficiency of a power amplifier in a communication device and an envelope delay optimization method.

According to an aspect of an example embodiment, there is provided a method of optimizing a delay value of an envelope. The method includes: estimating, in a test mode, a plurality of adjacent channel leakage ratios respectively corresponding a plurality of test delay values based on a test output signal output from a power amplifier, wherein the test output signal is generated by the power amplifier according to a test input signal corresponding to a plurality of frequencies; selecting a test delay value corresponding to a largest value among the plurality of estimated adjacent channel leakage ratios; and providing a supply voltage to the power amplifier based on an envelope signal delayed according to the selected test delay value in a normal mode. The estimating the plurality of adjacent channel leakage ratios includes, for each of the plurality of test delay values, estimating a corresponding adjacent channel leakage ratio based on a ratio of a magnitude of a component corresponding to the plurality of frequencies included in the test output signal and a magnitude of an inter-modulated component of the test output signal.

According to an aspect of an example embodiment, there is provided a method. The method includes converting a test output signal output from a power amplifier into a frequency domain, wherein the test output signal is generated based on an input of a tone signal corresponding to a plurality of selected frequencies that is sampled at a sampling rate; obtaining a plurality of aliasing frequencies corresponding to an aliased inter-modulated component based on the sampling rate and the plurality of selected frequencies; and estimating an adjacent channel leakage ratio based on a magnitude of a component corresponding to the plurality of selected frequencies and a magnitude of a component corresponding to the plurality of aliasing frequencies in the converted test output signal, in a frequency domain According to an aspect of an example embodiment, there is provided a communication device. The communication device includes a modem configured to generate a tone signal corresponding to a plurality of selected frequencies as a test input signal in a test mode; a power amplifier configured to generate a test output signal based on the test input signal transmitted through a signal transmission path; a voltage modulator configured to sequentially generate a delayed envelope signal based on each of a plurality of test delay values and sequentially provide a supply voltage to the power amplifier based on the delayed envelope signal, based on each of the plurality of test delay values in the test mode; and a controller configured to estimate an adjacent channel leakage ratio based on a magnitude of a component corresponding to the plurality of selected frequencies included in the test output signal and a magnitude of an inter-modulated component for each of the plurality of test delay values in the test mode, select a test delay value corresponding to a largest value among a plurality of estimated channel leakage ratios, and control the voltage modulator based on the test delay value in a normal mode.

According to an aspect of an example embodiment, there is provided method of optimizing a delay value of an envelope. The method includes: providing a tone signal corresponding to a plurality of selected frequencies as a test input signal; applying a first supply voltage to a power amplifier by delaying an envelope signal of the test input signal by using a first delay value to generate a first test output signal; estimating a first adjacent channel leakage ratio based on a magnitude of each of a plurality of components included in the first test output signal and an aliased inter-modulated component; applying a second supply voltage to the power amplifier by delaying the envelope signal of the test input signal using a second delay value to generate a second test output signal; estimating a second adjacent channel leakage ratio based on a magnitude of each of a plurality of components included in the second test output signal and the aliased inter-modulated component; and delaying the envelope signal corresponding to a baseband signal according to the first delay value in a normal mode based on the first adjacent channel leakage ratio being equal to or greater than the second adjacent channel leakage ratio and delaying the envelope signal according to the second delay value in the normal mode based on the first adjacent channel leakage ratio being less than the second adjacent channel leakage ratio.

According to an aspect of an example embodiment, there is provided method of optimizing a delay value of an envelope. The method includes: obtaining a plurality of estimated adjacent channel leakage ratios respectively corresponding to a plurality of test delay values by providing a modulated supply voltage using the plurality of test delay values to a power amplifier in a test mode; and providing a supply voltage to the power amplifier based on a delayed envelope signal based on a test delay value corresponding to a largest value among the plurality of estimated adjacent channel leakage ratios in a normal mode. The obtaining the plurality of estimated adjacent channel leakage ratios includes: providing, for each of the plurality of test delay values, a tone signal corresponding to a plurality of selected frequencies to a signal transmission path that includes the power amplifier; obtaining a magnitude of a component corresponding to the plurality of selected frequencies and a magnitude of an aliased inter-modulated component by converting a test output signal output from the power amplifier into a frequency domain; and estimating a corresponding adjacent channel leakage ratio based on the obtained magnitude.

BRIEF DESCRIPTION OF THE DRAWINGS

The above, and other aspects, features and advantages will be more clearly understood from the following detailed description of example embodiments, taken in conjunction with the accompanying drawings in which.

DETAILED DESCRIPTION

Hereinafter, example embodiments will be described in detail with reference to the accompanying drawings.

Figure 1:
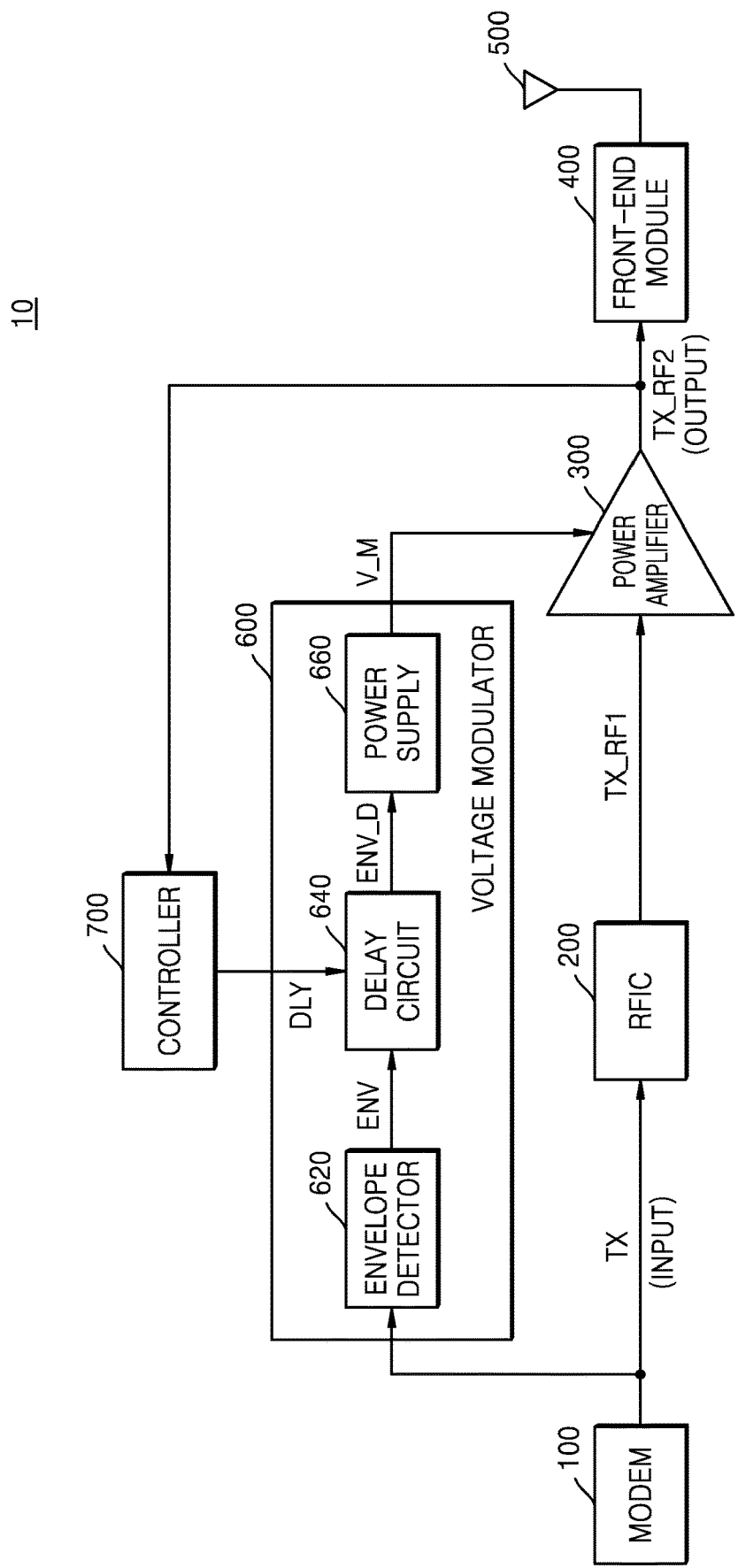
FIG. 1 is a view of a wireless communication device according to an example embodiment.

FIG. 1 is a view of a wireless communication device 10 according to an example embodiment. The wireless communication device 10 may include a modem 100, a radio frequency integrated circuit (RFIC) 200, a power amplifier 300, a front end module 400, an antenna 500, a voltage modulator 600, and a controller 700. In some example embodiments, the wireless communication device 10 may further include components not shown in FIG. 1. For example, a switch and/or a duplexer controlled according to a transmission mode or a reception mode may be between the power amplifier 300 and the front end module 400. In addition, in an example embodiment, the controller 700 may be an external device of the wireless communication device 10.

The wireless communication device 10 may connect to a wireless communication system by transmitting and receiving signals through the antenna 500. The wireless communication system to which the wireless communication device 10 connects may be referred to as a radio access technology (RAT), and may be a wireless communication system using a cellular network such as a 5th generation wireless (5G) system, a long term evolution (LTE) system, an LTE-Advanced system, a code division multiple access (CDMA) system, a global system for mobile communications (GSM) system, etc., as a non-limiting example, or may be a wireless local area network (WLAN) system or any other wireless communication system. Hereinafter, the wireless communication system to which the wireless communication device 10 connects will be described on the assumption that it is a wireless communication system using a cellular network, but it will be understood that example embodiments are not limited thereto.

A wireless communication network of the wireless communication system may support communication among multiple wireless communication devices, including the wireless communication device 10, by sharing available network resources. For example, in the wireless communication network, information may be transferred through various multiple access methods such as code division multiple access (CDMA), frequency division multiple access (FDMA), time division multiple access (TDMA), orthogonal frequency division multiple access (OFDMA), single carrier frequency division multiple access (SC-FDMA), OFDM-FDMA, OFDM-TDMA, and OFDM-CDMA.

The wireless communication device 10 may refer to any device that connects to the wireless communication system. For example, the wireless communication device 10 may refer to a base station BS. The base station BS may generally refer to a fixed station for communicating with user equipment and/or another base station, and may exchange data and control information by communicating with user equipment and/or another base station. For example, the base station may be referred to as Node B, evolved-Node B (eNB), next generation Node B (gNB), a sector, a site, a base transceiver system (BTS), an access point (AP), a relay node, a remote radio head (RRH), a radio unit (RU), a small cell, or the like. In this specification, the base station or a cell may have a comprehensive meaning indicating some areas or functions covered by a base station controller (BSC) in CDMA, Node-B in WCDMA, and eNB or the sector (site) in LTE, and may cover all of various coverage areas, such as a megacell, macrocell, microcell, picocell, femtocell, relay node, RRH, RU, and a small cell communication range.

For example, the wireless communication device 10 may refer to a user equipment (UE). The UE may be fixed or mobile, and may refer to any devices capable of transmitting and receiving data and/or control information by communicating with a base station. For example, the UE may be referred to as terminal equipment, a mobile station (MS), a mobile terminal (MT), a user terminal (UT), a subscriber station (SS), a wireless device, or a handheld device. In this specification, the wireless communication device 10 is generally described as the UE, but it will be understood that example embodiments are not limited thereto.

Referring to FIG. 1, the antenna 500 may be connected to the front end module 400, and may transmit a signal provided from the front end module 400 to another wireless communication device or may provide a signal received from another wireless communication device to the front end module 400. In FIG. 1, some components used to receive signals from other wireless communication devices through the antenna 500 may be omitted. In some example embodiments, the wireless communication device 10 may include a plurality of antennas for a phased array, multiple-input and multiple-output (MIMO), and the like.

The modem 100 may generate a signal including information to be transmitted through the antenna 500. In some example embodiments, the modem 100 may include an encoder, a modulator, a filter, a digital-to-analog converter (DAC), and the like. For example, the modem 100 may generate a transmission signal TX and may provide the transmission signal TX to the RFIC 200 and the voltage modulator 600. In an example embodiment, the modem 100 may generate a baseband transmission signal in a normal mode of the wireless communication device 10 and provide the baseband transmission signal to the RFIC 200 and the voltage modulator 600. In an example embodiment, the modem 100 may generate a test input signal INPUT in a test mode of the wireless communication device 10 and provide the test input signal INPUT to the RFIC 200 and the voltage modulator 600. The test mode may refer to a mode for obtaining an optimum delay value among a plurality of test delay values by comparing respective adjacent channel leakage ratios for a plurality of test delay values. In an example embodiment, the test input signal INPUT is a signal corresponding to a plurality of frequencies selected from a channel band, and may be, for example, tone signals for at least two selected frequencies. However, example embodiments are not limited thereto. The test input signal INPUT may include a plurality of frequency band signals, and each of the plurality of frequency bands is a unit frequency band generated by a resource block, and may be a band including at least one frequency. The test input signal INPUT will be described in more detail with reference to FIGS. 5A and 5B.

The RFIC 200 may receive the transmission signal TX from the modem 100 and may generate a first RF transmission signal TX_RF1 from the transmission signal TX. For example, the RFIC 200 may include a mixer, a filter, and an amplifier. The RFIC 200 may be included on a signal transmission path through which the transmission signal TX is transmitted, and may transmit the transmission signal TX to the power amplifier 300.

The power amplifier 300 may generate a second RF transmission signal TX_RF2 by amplifying the first RF transmission signal TX_RF1 by using power provided by a modulated supply voltage V_M. In a test mode of the wireless communication device 10, the test input signal INPUT generated by the modem 100 is provided to the power amplifier 300 through the signal transmission path including the RFIC 200, and the power amplifier 300 may output a test output signal OUTPUT based on the test input signal INPUT received through the signal transmission path. The power amplifier 300 may provide the test output signal OUTPUT to the controller 700.

The voltage modulator 600 may modulate a supply voltage provided to the power amplifier 300 based on an envelope signal ENV generated by detecting an envelope of the transmission signal TX. For example, the voltage modulator 600 may generate the modulated supply voltage V_M following the envelope signal ENV, and may provide the modulated supply voltage V_M to the power amplifier 300.

The voltage modulator 600 may include an envelope detector 620, a delay circuit 640, and a power supply 660.

The envelope detector 620 may generate the envelope signal ENV by detecting an envelope of the transmission signal TX provided from the modem 100. The envelope detector 620 may provide the envelope signal ENV to the delay circuit 640.

The delay circuit 640 may generate a delayed envelope signal ENV_D by delaying the envelope signal ENV based on a delay value DLY provided by the controller 700, and may provide the delayed envelope signal ENV_D to the power supply 660. For example, in the test mode, the delay circuit 640 may generate the delayed envelope signal ENV_D by delaying the envelope signal ENV based on each of a plurality of test delay values provided as the delay value DLY from the controller 700. In addition, for example, in the normal mode, the delay circuit 640 may generate the delayed envelope signal ENV_D by delaying the envelope signal ENV based on an optimized delay value provided as the delay value DLY from the controller 700, The reason why the delay of the envelope signal ENV is required will be described in more detail with reference to FIGS. 2B and 2C.

The power supply 660 may generate the modulated supply voltage V_M based on the delayed envelope signal ENV_D, and may provide the modulated supply voltage V_M to the power amplifier 300.

The controller 700 may control the delay circuit 640 based on the delay value DLY. For example, the controller 700 may control the delay circuit 640 by providing the optimized delay value as the delay value DLY to the delay circuit 640 in the normal mode. Also, for example, the controller 700 may control the delay circuit 640 by providing each of the plurality of test delay values as the delay value DLY to the delay circuit 640 in the test mode.

In an example embodiment, the controller 700 may select one of a plurality of test delay values as the optimized delay value. To this end, in the test mode, the controller 700 may estimate an adjacent channel leakage ratio based on the test output signal OUTPUT for each of the plurality of test delay values. In more detail, in the test mode, the controller 700 may provide a test delay value as the delay value DLY to the delay circuit 640, the voltage modulator 600 may provide the modulated supply voltage V_M based on a delayed envelope signal based on the test delay value to the power amplifier 300, and the power amplifier 300 may output the test output signal OUTPUT by amplifying the test input signal INPUT received through a signal transmission path using the modulated supply voltage V_M. When the test input signal INPUT is a tone signal for a plurality of selected frequencies, the test output signal OUTPUT may include a fundamental frequency component and an inter-modulated component. The fundamental frequency component may indicate a component corresponding to the plurality of selected frequencies. In addition, the inter-modulated component is a harmonic component of the plurality of selected frequencies, and may include a 3rd-order inter-modulated component and a 5th-order inter-modulated component in an example embodiment. The controller 700 may estimate an adjacent channel leakage ratio based on a ratio of the magnitude of the fundamental frequency component and the magnitude of the inter-modulated component included in the test output signal OUTPUT. In other words, the controller 700 may obtain a plurality of estimated adjacent channel leakage ratios for a plurality of test delay values. The controller 700 may select a test delay value corresponding to the largest adjacent channel leakage ratio among the plurality of estimated adjacent channel leakage ratios, and may use the selected test delay value as an optimized delay value.

As technology advances, a bandwidth of the transmission signal TX continues to widen. In order to measure an adjacent channel leakage ratio for the transmission signal TX having a wide bandwidth, a wireless communication device according to a comparative example needs to support a high sampling rate. For example, in order to measure an adjacent channel leakage ratio for the transmission signal TX having a bandwidth of 100 MHz, the wireless communication device according to the comparative example needs to support a sampling rate of at least 300 MHz. However, for the wireless communication device to support a high sampling rate, it requires excessive power consumption or a high hardware cost.

According to the wireless communication device 10 according to an example embodiment, in a test mode, an adjacent channel leakage ratio may be estimated based on the magnitudes of a fundamental frequency component and an inter-modulated component included in the test output signal OUTPUT output according to the input of the test input signal INPUT, such as a tone signal corresponding to a plurality of frequencies selected in a channel band. In particular, when an inter-modulated frequency corresponding to the inter-modulated component is greater than a sampling rate (or half of the sampling rate), the controller 700 may estimate the adjacent channel leakage ratio based on the magnitudes of the fundamental frequency component and an aliased inter-modulated component.

Furthermore, the wireless communication device 10 according to an example embodiment may select an optimized delay value among a plurality of test delay values by estimating adjacent channel leakage ratios for the plurality of test delay values, and may synchronize the transmission signal TX with the envelope signal ENV by controlling the delay circuit 640 based on the optimized delay value in the normal mode. Accordingly, the efficiency of the power amplifier 300 may be increased.

Figure 2A:
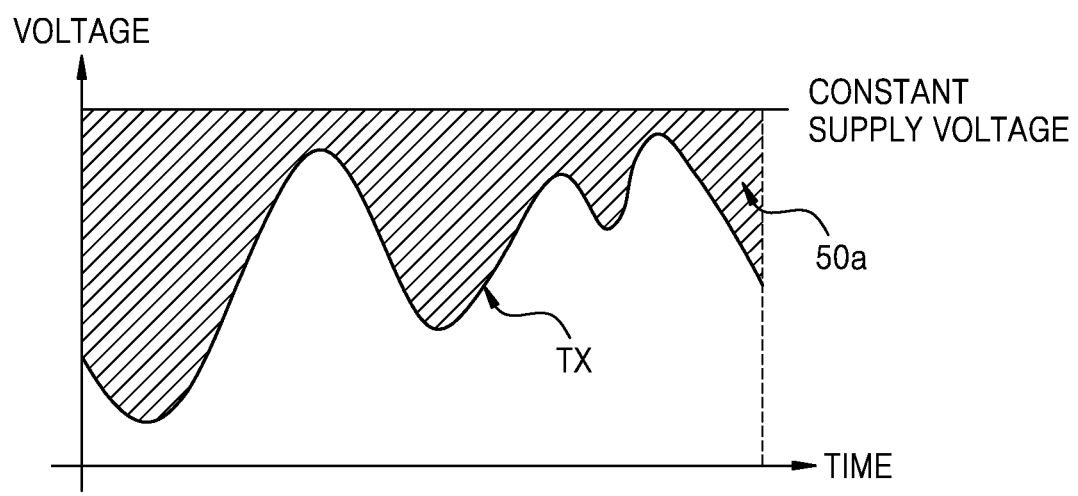
FIG. 2A is a graph of a supply voltage according to a comparative example.

FIG. 2A is a graph of a supply voltage according to a comparative example. FIG. 2A shows a graph of the transmission signal TX and the supply voltage over time when the supply voltage applied to a power amplifier is a constant voltage.

When the supply voltage applied to the power amplifier is constant, because a value of the supply voltage needs to be greater than the maximum value of the transmission signal TX, a time period occurs in which a difference between the transmission signal TX and the supply voltage widens.

Accordingly, heat loss occurs in the graph by an amount corresponding to an area 50a between a supply voltage line and the transmission signal TX.

Figure 2B:
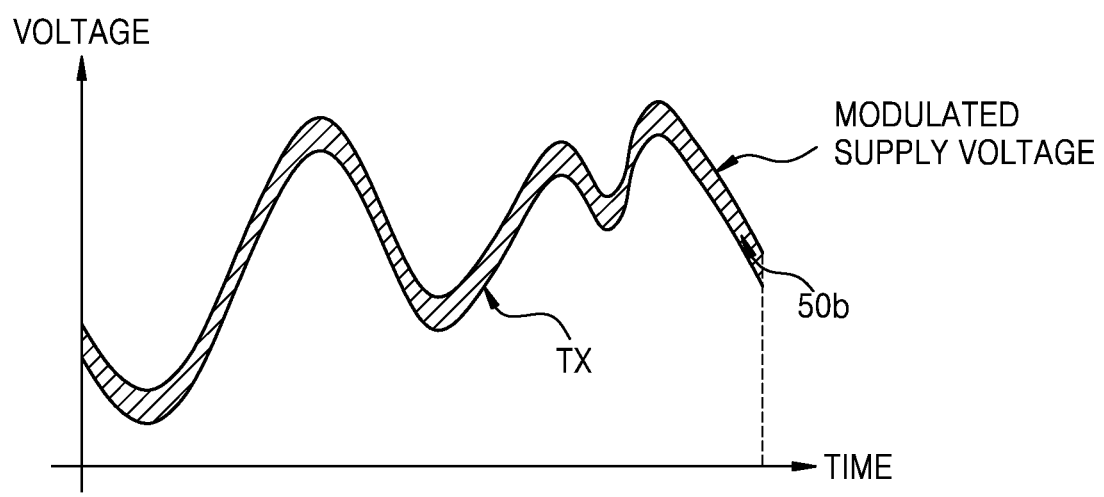
FIG. 2B is a graph of a modulated supply voltage according to an example embodiment.

FIG. 2B is a graph of a modulated supply voltage according to an example embodiment. In particular, FIG. 2B shows a graph of the first RF transmission signal TX_RF1 and the modulated supply voltage over time when the modulated supply voltage is applied to the power amplifier 300, according to an example embodiment. FIG. 2B is described with reference to FIG. 1.

The voltage modulator 600 included in the wireless communication device 10 according to an example embodiment may detect the envelope signal ENV from the transmission signal TX, and may generate the modulated supply voltage V_M such that the modulated supply voltage V_M follows an envelope of the transmission signal TX.

Figure 5A:
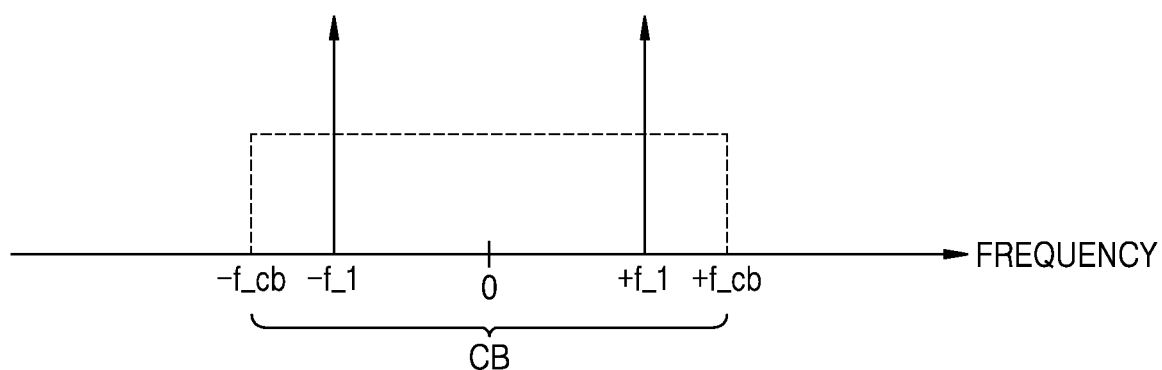
FIGS. 5A and 5B are views illustrating frequency characteristics of test input signals in a test mode according to an example embodiment.

Accordingly, it can be seen that an area 50b between a modulated supply voltage line indicating heat loss and the transmission signal TX is very small compared to the area 50a of FIG. 5A. In other words, it can be stated that as the modulated supply voltage V_M follows the envelope of the transmission signal TX, heat loss of the wireless communication device 10 is reduced and thermal efficiency is increased.

Figure 2C:
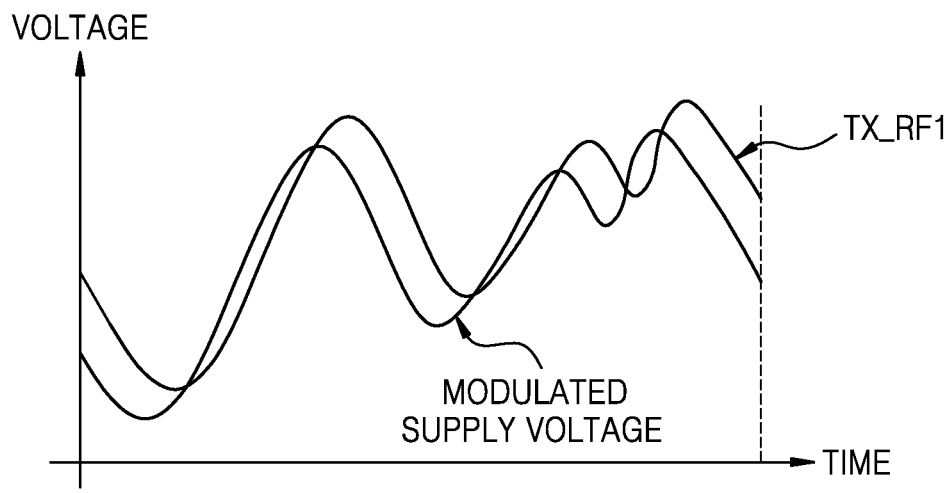
FIG. 2C is a graph of a supply voltage according to a comparative example that is not synchronized with an input signal.

FIG. 2C is a graph of a supply voltage according to a comparative example that is not synchronized with an input signal. FIG. 2C shows a graph when the modulated supply voltage supplied to the power amplifier and the first RF transmission signal TX_RF1 are not synchronized with each other. FIG. 2C is described with reference to FIG. 1.

Referring to FIG. 1, a path of the transmission signal TX output from the modem 100 to the power amplifier 300 through the RFIC 200 and a path to reach the power amplifier 300 through the voltage modulator 600 are different from each other, and a phase of the modulated supply voltage V_M input to the power amplifier 300 and a phase of the first RF transmission signal TX_RF1 may not match each other (or may not be synchronized with each other).

In the case of FIG. 2C, compared to the example embodiment of FIG. 2B, a linearity characteristic of the power amplifier 300 may be deteriorated. Accordingly, the wireless communication device 10 needs to delay the envelope signal ENV by an appropriate delay value to match the phases of the modulated supply voltage V_M and the first RF transmission signal TX_RF1 with each other.

According to the wireless communication device 10 according to an example embodiment, the controller 700 provides an optimized delay value to the delay circuit 640 so that the phase of the modulated supply voltage V_M input and the phase of the first RF transmission signal TX_RF1 may match each other.

Figure 3:
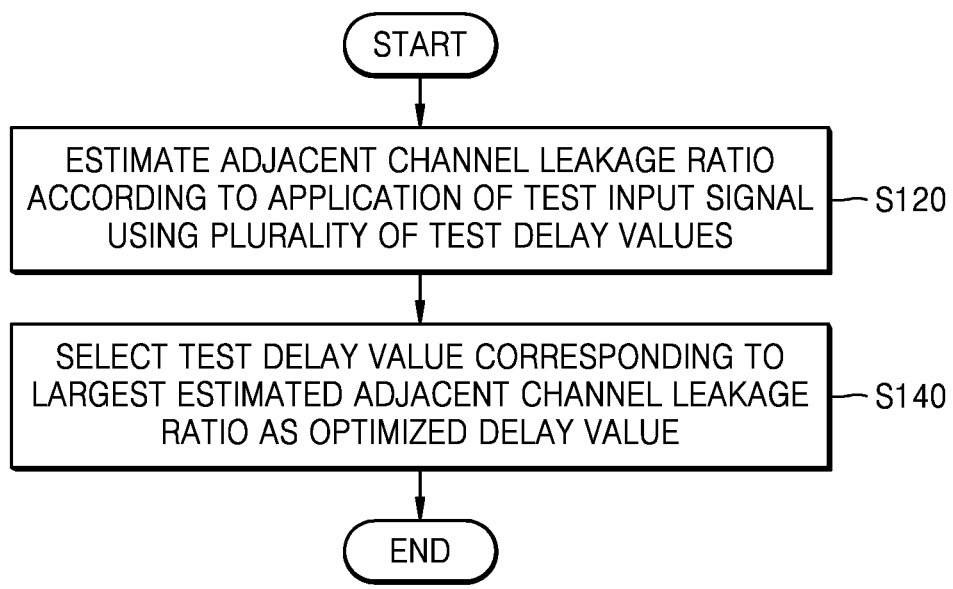
FIG. 3 is a flowchart of an envelope delay optimization method according to an example embodiment.

FIG. 3 is a flowchart of an envelope delay optimization method according to an example embodiment. FIG. 3 is described with reference to FIG. 1.

In operation S120, in the test mode, the wireless communication device 10 may estimate an adjacent channel leakage ratio by applying the test input signal INPUT using a plurality of test delay values. For example, in the test mode, the modem 100 may output the test input signal INPUT corresponding to a plurality of frequencies selected in a channel band. The voltage modulator 600 may output the modulated supply voltage V_M based on the test input signal INPUT using each of a plurality of test delay values. The controller 700 may estimate the adjacent channel leakage ratio using the test output signal OUTPUT output from the power amplifier 300 based on the modulated supply voltage V_M. Through this, the controller 700 may obtain a plurality of estimated adjacent channel leakage ratios respectively corresponding to the plurality of test delay values.

In operation S140, the wireless communication device 10 may select a test delay value corresponding to the largest estimated adjacent channel leakage ratio among the plurality of estimated adjacent channel leakage ratios as an optimized delay value. The controller 700 may provide the optimized delay value as the delay value DLY to the delay circuit 640 in the normal mode, and the delay circuit 640 may output the delayed envelope signal ENV_D by delaying the envelope signal ENV based on the delay value DLY. The power supply 660 may output the modulated supply voltage V_M based on the delayed envelope signal ENV_D.

Figure 4:
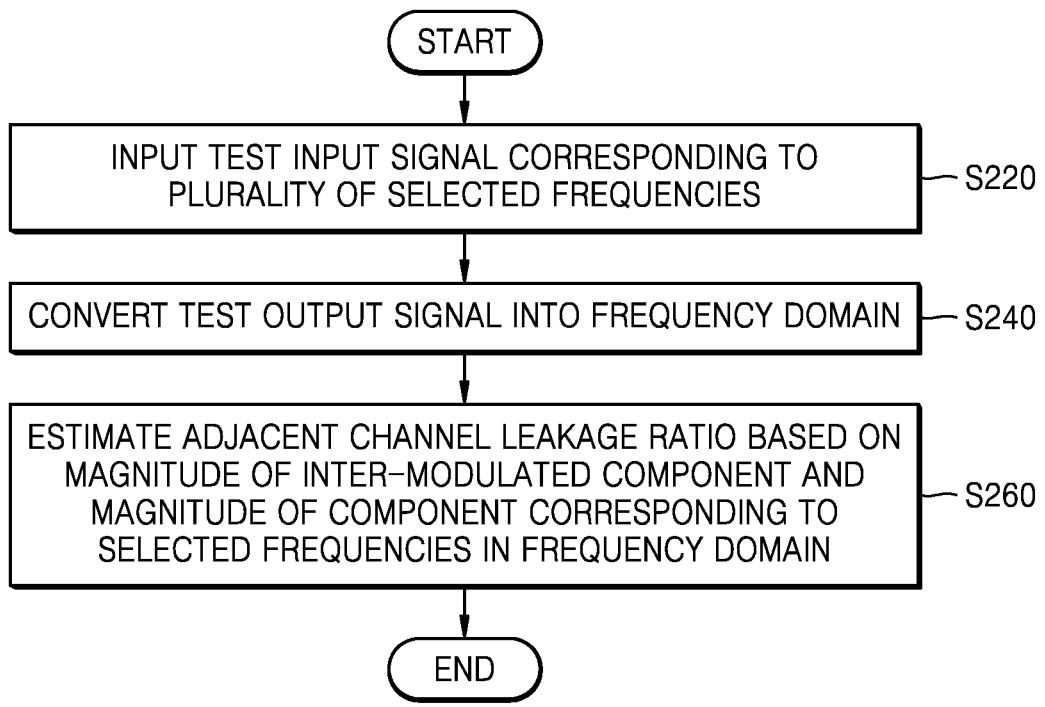
FIG. 4 is a flowchart of an envelope delay optimization method according to an example embodiment.

FIG. 4 is a flowchart of an envelope delay optimization method according to an example embodiment. In particular, FIG. 4 may be a flowchart illustrating a detailed example embodiment of operation S120 of FIG. 3. FIG. 4 is described with reference to FIG. 1.

In operation S220, the wireless communication device 10 may input the test input signal INPUT corresponding to a plurality of selected frequencies to a signal transmission path including the power amplifier 300. For example, the test input signal INPUT may be a tone signal corresponding to a plurality of frequencies selected in a channel band, as shown in FIG. 5A. In addition, in an example embodiment, the test input signal INPUT may be a signal including a small frequency band that includes the plurality of selected frequencies, as shown in FIG. 5B.

In operation S240, the wireless communication device 10 may convert the test output signal OUTPUT into a frequency domain. For example, the controller 700 may convert the test output signal OUTPUT output from the power amplifier 300 into a frequency domain according to an input of the test input signal INPUT. In an example embodiment, the controller 700 may convert the test output signal OUTPUT into the frequency domain by performing a Fourier transform using the test output signal OUTPUT. In an example embodiment, the controller 700 may convert the test output signal OUTPUT into the frequency domain by performing a fast Fourier transform (FFT) using the test output signal OUTPUT.

In operation S260, the wireless communication device 10, in the frequency domain, may estimate an adjacent channel leakage ratio based on the magnitude of an inter-modulated component and the magnitude of a component corresponding to the plurality of selected frequencies. For example, the controller 700, in the frequency domain, may estimate the adjacent channel leakage ratio based on a ratio of the magnitude of a fundamental frequency component and the magnitude of the inter-modulated component included in the test output signal OUTPUT. In an example embodiment, the inter-modulated component may include a 3rd-order inter-modulated component and/or a 5th-order inter-modulated component. Also, in an example embodiment, when half of a sampling rate is less than three times a selected frequency, the controller 700 may estimate an adjacent channel leakage ratio based on a ratio of the magnitude of the fundamental frequency component and the magnitude of an aliased inter-modulated component.

Figure 5B:
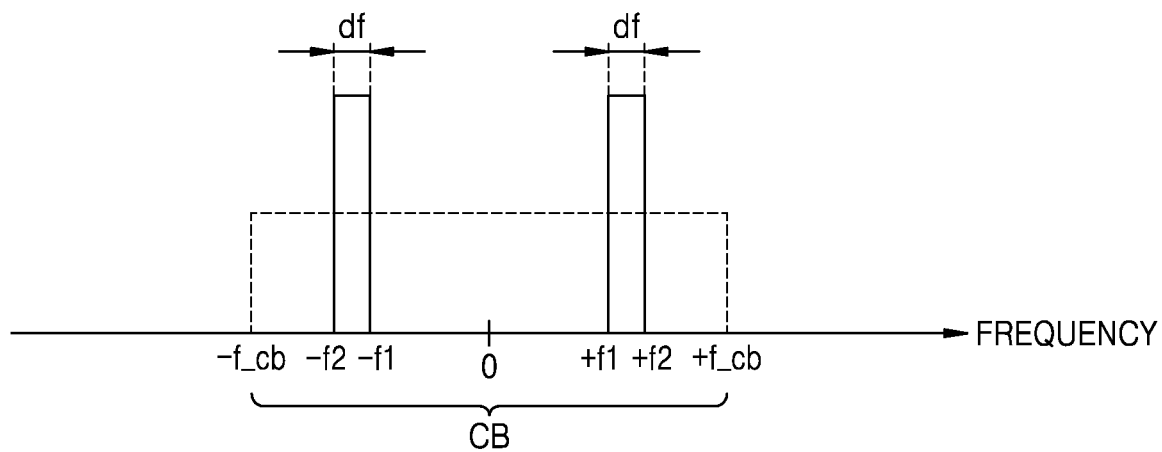

FIGS. 5A and 5B are views illustrating frequency characteristics of test input signals in a test mode according to an example embodiment. FIGS. 5A and 5B may illustrate an example embodiment of the test input signal INPUT of FIG. 1. FIGS. 5A and 5B are described with reference to FIG. 1.

Referring to FIG. 5A, the test input signal INPUT may be a tone signal corresponding to a plurality of frequencies selected in a channel band CB. The plurality of selected frequencies may include a first frequency and a second frequency, wherein the second frequency may be a frequency having the same magnitude as the first frequency and different only in sign. For example, the plurality of selected frequencies may include a positive first frequency +f_1 and a negative first frequency −f_1. In other words, the test input signal INPUT may be a tone signal having a positive first frequency +f_1 component and a negative first frequency −f_1 component. The first frequency f_1 may be equal to or less than a channel band frequency f_cb. The channel band frequency f_cb may correspond to half of a bandwidth of the channel band CB, and in an example embodiment, the first frequency f_1 may be the channel band frequency f_cb.

Referring to FIG. 5B, the test input signal INPUT may include a plurality of bandwidth components corresponding to a plurality of frequencies selected in the channel band CB, and each of the plurality of bandwidth components may include a component corresponding to the plurality of frequencies and may correspond to a unit bandwidth signal generated by a resource block in the modem 100. For example, the plurality of selected frequencies may include the positive first frequency +f_1 and the negative first frequency −f_1. The test input signal INPUT includes a component corresponding to the positive first frequency +f_1 and may include a bandwidth component having a bandwidth df, and includes a component corresponding to the negative first frequency −f_1 and may include the bandwidth component having the bandwidth df. The bandwidth df may correspond to a unit bandwidth of one resource block in the modem 100.

Figure 6:
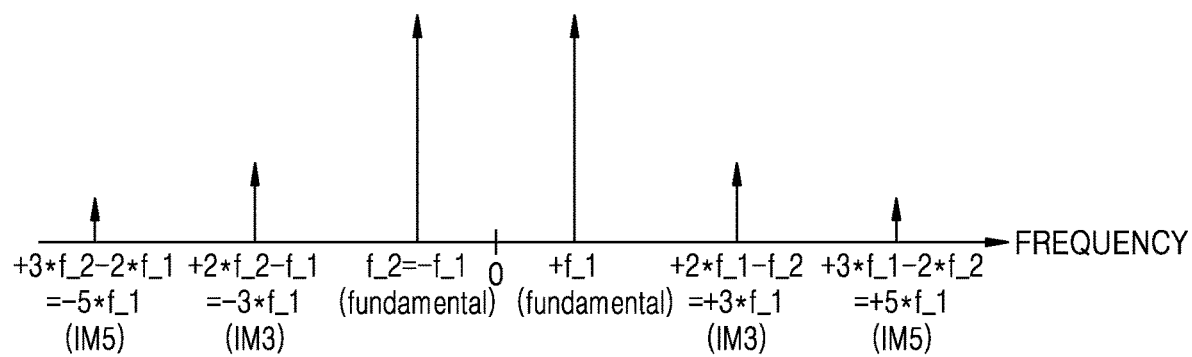
FIG. 6 is a view illustrating frequency characteristics of test output signals in a test mode according to an example embodiment.

FIG. 6 is a view illustrating frequency characteristics of test output signals in a test mode according to an example embodiment. In particular, FIG. 6 may be a view illustrating frequency characteristics of test output signals generated according to an input of a test input signal as shown in FIG. 5A. FIG. 6 is described with reference to FIG. 1.

Referring to FIG. 5A, the test input signal INPUT may include a component corresponding to the positive first frequency +f_1 and a component corresponding to the negative first frequency −f_1. In other words, the test input signal INPUT may include a component corresponding to a first frequency f_1 and a component corresponding to a second frequency f_2, and the second frequency f_2 may be the negative first frequency −f_1. The test output signal OUTPUT, which is output in response to the test input signal INPUT being input to a signal transmission path including the RFIC 200 and the power amplifier 300, may include a fundamental frequency component and an inter-modulated component corresponding to each of a plurality of selected frequencies. For example, the test output signal OUTPUT may include a fundamental frequency component, a 3rd-order inter-modulated component and a 5th-order inter-modulated component. The fundamental frequency component may include a component corresponding to the positive first frequency +f_1 and a component corresponding to the negative first frequency −f_1. The 3rd-order inter-modulated component may include a component corresponding to $2*f\_1-f\_2$ and a component corresponding to $2*f\_2-f\_1$. In an example embodiment, when f_2 is equal to −f_1, the 3rd-order inter-modulated component may include a component corresponding to $3*f\_1$ and a component corresponding to $-3*f\_1$. The 5th-order inter-modulated component may include a component corresponding to $3*f\_1-f\_2$ and a component corresponding to $3*f\_2-f\_1$. In an example embodiment, when f_2 is equal to −f_1, the 5th-order inter-modulated component may include a component corresponding to $5*f\_1$ and a component corresponding to $-5*f\_1$.

The controller 700 according to an example embodiment may estimate an adjacent channel leakage ratio based on a ratio of the magnitude of the fundamental frequency component and the magnitude of the inter-modulated component by converting the test output signal OUTPUT to a frequency domain.

FIG. 6 shows frequency characteristics of the test output signal OUTPUT when a half sampling frequency corresponding to half of a sampling rate of the wireless communication device 10 is greater than 3 times and 5 times a selected frequency (e.g., the first frequency f_1). When the half sampling frequency is less than three times the first frequency f_1, inter-modulated components of the test output signal OUTPUT may be aliased. Aliased inter-modulated components will be described in more detail with reference to FIG. 7 below.

Figure 7:
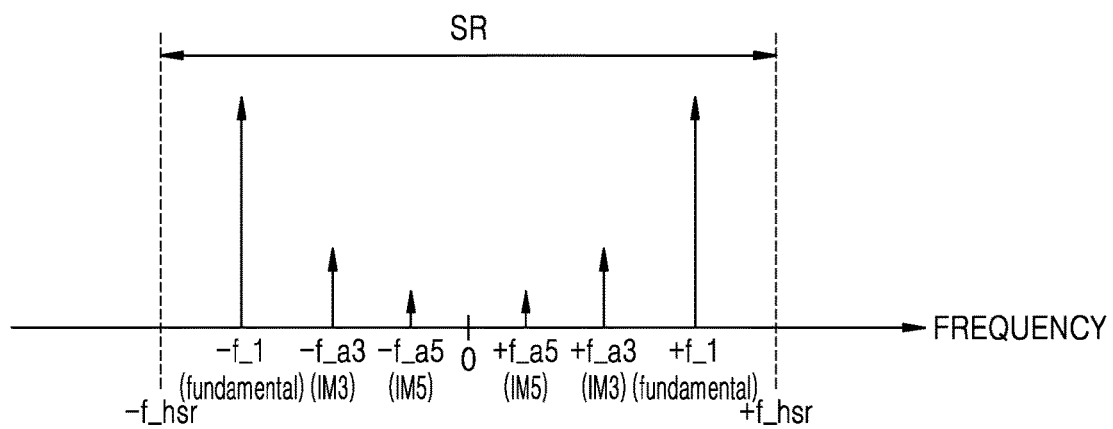
FIG. 7 is a view illustrating frequency characteristics of test output signals in a test mode according to an example embodiment.

FIG. 7 is a view illustrating frequency characteristics of test output signals in a test mode according to an example embodiment. In particular, FIG. 7 may show frequency characteristics of test output signals generated according to the input of the test input signal INPUT as shown in FIG. 5A in the wireless communication device 10 supporting a limited sampling rate SR. In particular, FIG. 7 shows a case in which a half sampling frequency f_hsr corresponding to half the sampling rate SR is greater than the first frequency f_1 but less than 3 times the first frequency f_1 as compared with FIG. 6.

Because the first frequency f_1 corresponding to a fundamental frequency component of the test output signal OUTPUT is less than the half sampling frequency f_hsr, the test output signal OUTPUT may have a fundamental frequency component corresponding to the positive first frequency +f_1 and the negative first frequency −f_1 without moving a position in a frequency domain.

Additionally, because a frequency corresponding to the 3rd-order inter-modulated component of the test output signal OUTPUT is greater than the half sampling frequency f_hsr, the 3rd-order inter-modulated component is down-sampled, and a component corresponding to the 3rd-order inter-modulated component may appear at a 3rd-order aliasing frequency f_a3. The component appearing at the 3rd-order aliasing frequency f_a3 will be referred to as an aliased 3rd-order inter-modulated component. A relationship between the 3rd-order aliasing frequency f_a3 and the first frequency f_1 may be as shown in Equation 1 below.

$$f\_a3 = 3*f\_1 - f\_\text{hsr}*[3*f\_1/f\_\text{hsr}]$$ [Equation 1]

In Equation 1, a symbol '[ ]' is a Gaussian function and is a function that outputs the largest integer among integers that are not larger than an input value. As a non-limiting example for convenience of description, when the first frequency f_1 is 50 MHz and the sampling rate SR is 122.88 MHz, the Gaussian function may be 2, and may be obtained by multiplying 3 by 50 MHz and dividing by 61.44 MHz, which is 2.44. The largest integer among integers that are not larger than 2.44 is 2. Therefore, the third aliasing frequency f_a3 may be 27.12 MHz obtained by subtracting a value obtained by multiplying 2 by 61.44 MHz from 150 MHz.

Likewise, because a frequency corresponding to the 5th-order inter-modulated component of the test output signal OUTPUT is greater than the half sampling frequency f_hsr, the 5th-order inter-modulated component is down-sampled, and a component corresponding to the 5th-order inter-modulated component may appear at a 5th-order aliasing frequency f_a5. The component appearing at the 5th-order aliasing frequency f_a5 will be referred to as an aliased 5th-order inter-modulated component. A relationship between the 5th-order aliasing frequency f_a5 and the first frequency f_1 may be as shown in Equation 2 below.

$$f\_a5 = 5*f\_1 - f\_\text{hsr}*[5*f\_1/f\_\text{hsr}]$$ [Equation 2]

In Equation 2, [ ] is a Gaussian function and is a function that outputs the largest integer among integers that are not larger than an input value. As a non-limiting example for convenience of description, when the first frequency f_1 is 50 MHz and the sampling rate SR is 122.88 MHz, the Gaussian function may be 4, and may be obtained by multiplying 5 by 50 MHz and dividing by 61.44 MHz, which is 4.06. The largest integer among integers that are not larger than 4.06 is 4. Therefore, the 5th-order aliasing frequency f_a5 may be 4.24 MHz obtained by subtracting a value obtained by multiplying 4 by 61.44 MHz from 250 MHz. As a non-limiting example for convenience of description, when the first frequency f_1 is 40 MHz and the sampling rate SR is 122.88 MHz (i.e., when the half sampling frequency f_hsr is 61.44 MHz), the 5th-order aliasing frequency f_a5 may be 15.68 MHz obtained by subtracting a value obtained by multiplying 3 by 61.44 MHz from 200 MHz.

Figure 8:
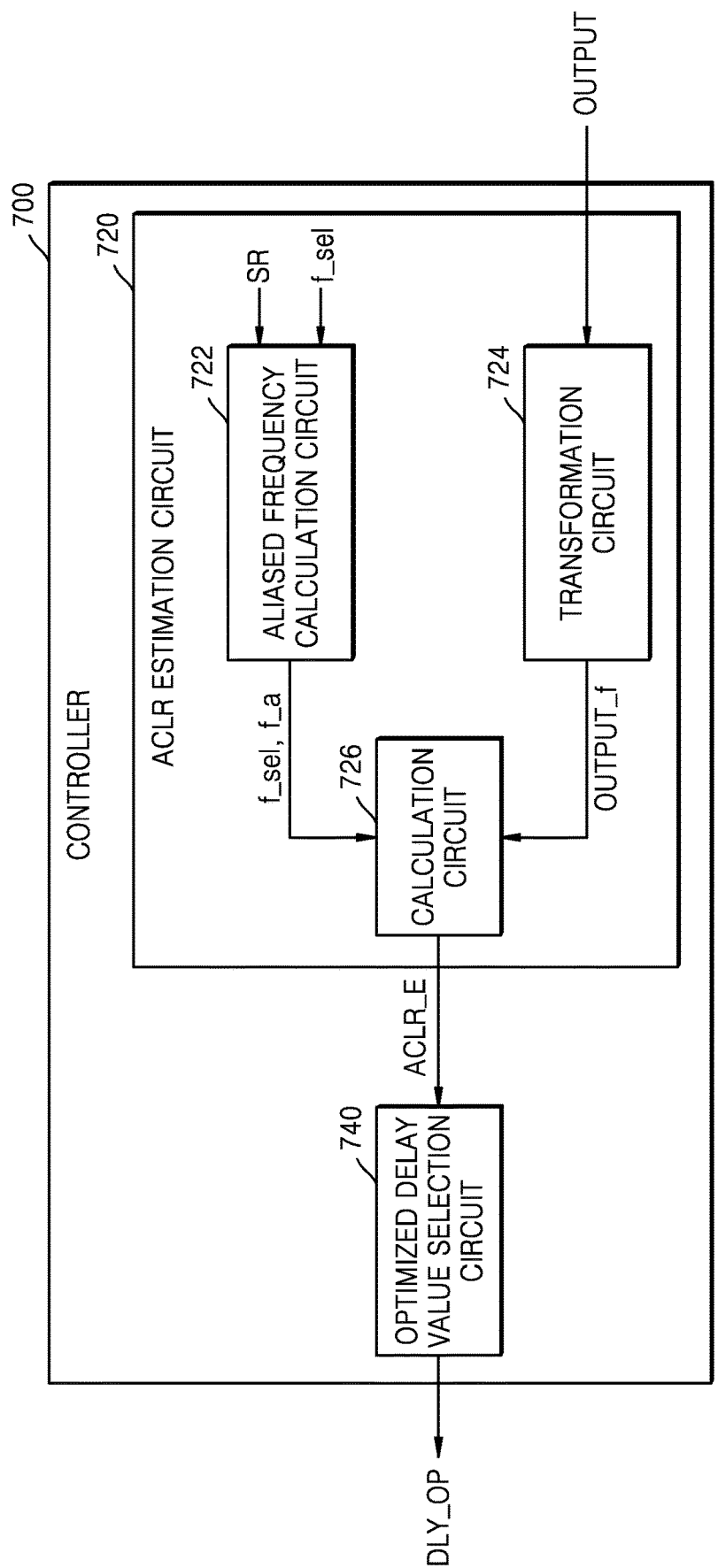
FIG. 8 is a view of a controller according to an example embodiment.

FIG. 8 is a view of the controller 700 according to an example embodiment. The controller 700 may correspond to the controller 700 of FIG. 1. FIG. 8 is described with reference to FIG. 1.

The controller 700 may include an adjacent channel leakage ratio (ACLR) estimation circuit 720 and an optimized delay value selection circuit 740.

In a test mode, the ACLR estimation circuit 720 may estimate a channel adjacent leakage ratio based on the test output signal OUTPUT according to a test delay value, and may generate an estimated channel adjacent leakage ratio ACLR_E. For example, the ACLR estimation circuit 720 may convert the test output signal OUTPUT into a frequency domain, and may obtain a plurality of aliasing frequencies f_a based on the sampling rate SR and a plurality of selected frequencies f_sel. The ACLR estimation circuit 720, based on a converted test output signal OUTPUT_f, may obtain the estimated channel adjacent leakage ratio ACLR_E based on the magnitude of a component corresponding to the plurality of selected frequencies f_sel and the magnitude of a component corresponding to the plurality of aliasing frequencies f_a.

To this end, the ACLR estimation circuit 720 may include an aliasing frequency calculation circuit 722, a transformation circuit 724, and a calculation circuit 726.

The aliasing frequency calculation circuit 722 may obtain the plurality of aliasing frequencies f_a based on the sampling rate SR and the plurality of selected frequencies f_sel within a channel band. For example, the aliasing frequency calculation circuit 722 may obtain a 3rd-order aliasing frequency and/or a 5th-order aliasing frequency in the same manner as in Equation 1 and Equation 2. The aliasing frequency calculation circuit 722 may provide the plurality of selected frequencies f_sel and the plurality of aliasing frequencies f_a to the calculation circuit 726.

The transformation circuit 724 may output the converted test output signal OUTPUT_f by converting the test output signal OUTPUT into the frequency domain. The transformation circuit 724 may sample the test output signal OUTPUT at the sampling rate SR. For example, the transformation circuit 724 may transform the test output signal OUTPUT using a Fourier transform, and in an example embodiment, the transformation circuit 724 may use a fast Fourier transform.

The calculation circuit 726 may obtain an estimated adjacent channel leakage ratio ACLR_E based on the magnitude of a component corresponding to the plurality of selected frequencies f_sel included in the converted test output signal OUTPUT_f and the magnitude of a component corresponding to the plurality of aliasing frequencies f_a. For example, the calculation circuit 726 may obtain an estimated adjacent channel leakage ratio ACLR_E by dividing the magnitude of the component corresponding to the plurality of selected frequencies f_sel included in the converted test output signal OUTPUT_f by the magnitude of the component corresponding to the plurality of aliasing frequencies f_a. The calculation circuit 726 may provide the estimated adjacent channel leakage ratio ACLR_E to the optimized delay value selection circuit 740.

The optimized delay value selection circuit 740 may accumulate a plurality of estimated adjacent channel leakage ratios corresponding to a plurality of test delay values. The optimized delay value selection circuit 740 may select a test delay value corresponding to the largest adjacent channel leakage ratio among the plurality of estimated adjacent channel leakage ratios as an optimized delay value DLY_OP. The controller 700 may provide the optimized delay value DLY_OP to the delay circuit 640 in a normal mode.

Figure 9:
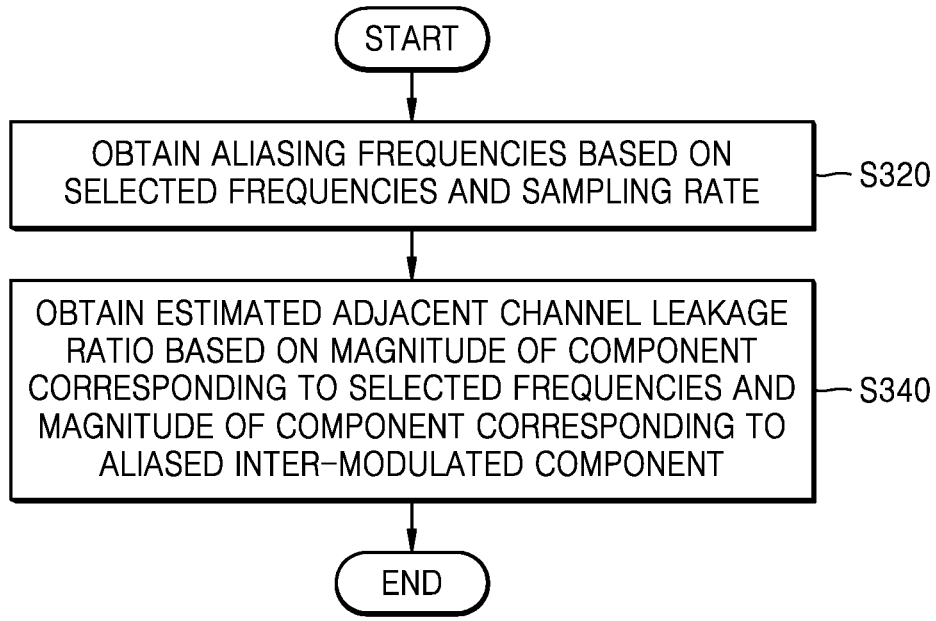
FIG. 9 is a flowchart of an envelope delay optimization method according to an example embodiment.

FIG. 9 is a flowchart of an envelope delay optimization method according to an example embodiment. In particular, FIG. 9 may show a detailed flowchart of operation S260 of FIG. 4. FIG. 9 is described with reference to FIGS. 1 and 8.

In operation S320, the controller 700 may obtain the plurality of aliasing frequencies f_a based on the plurality of selected frequencies f_sel and the sampling rate SR. The plurality of aliasing frequencies f_a may be obtained with reference to Equation 1 and Equation 2, and may be obtained with reference to FIG. 10 below.

In operation S340, the controller 700 may obtain the estimated adjacent channel leakage ratio ACLR_E based on the magnitude of a component corresponding to the plurality of selected frequencies f_sel and the magnitude of a component corresponding to an aliased inter-modulated component.

Figure 10:
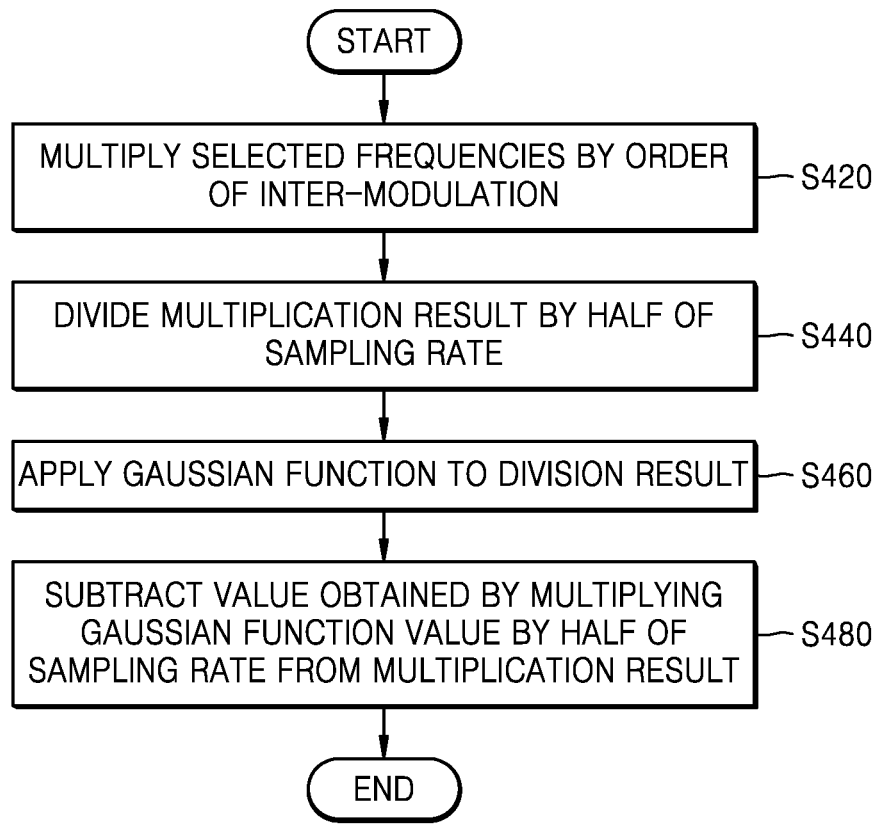
FIG. 10 is a flowchart of an envelope delay optimization method according to an example embodiment.

FIG. 10 is a flowchart of an envelope delay optimization method according to an example embodiment. In particular, FIG. 10 may show a detailed flowchart of operation S320 of FIG. 9. That is, FIG. 10 may be a flowchart of a method of obtaining an aliasing frequency based on Equation 1 and Equation 2. FIG. 10 is described with reference to FIGS. 1 and 8.

In operation S420, the controller 700 may obtain a multiplication result by multiplying a plurality of selected frequencies by an order of inter-modulation. For example, when obtaining an aliasing frequency corresponding to a 3rd-order inter-modulated component, the controller 700 may multiply the selected frequency by 3, and when obtaining an aliasing frequency corresponding to a 5th-order inter-modulated component, the controller 700 may multiply the selected frequency by 5.

In operation S440, the controller 700 may divide the multiplication result by half of the sampling rate SR. For example, the controller 700 may divide the multiplication result of operation S420 by the half sampling frequency f_hsr corresponding to half of the sampling rate SR.

In operation S460, the controller 700 may apply a Gaussian function to a division result. For example, the controller 700 may obtain a Gaussian function value by applying the Gaussian function to the division result in operation S440.

In operation S480, the controller 700 may subtract a value obtained by multiplying the Gaussian function value by half of the sampling rate SR from the multiplication result in operation S420. For example, the controller 700 may obtain the aliasing frequency by subtracting a value obtained by multiplying the Gaussian function value of the operation S460 by the half sampling frequency f_hsr from the multiplication result of operation S420.

Figure 11A:
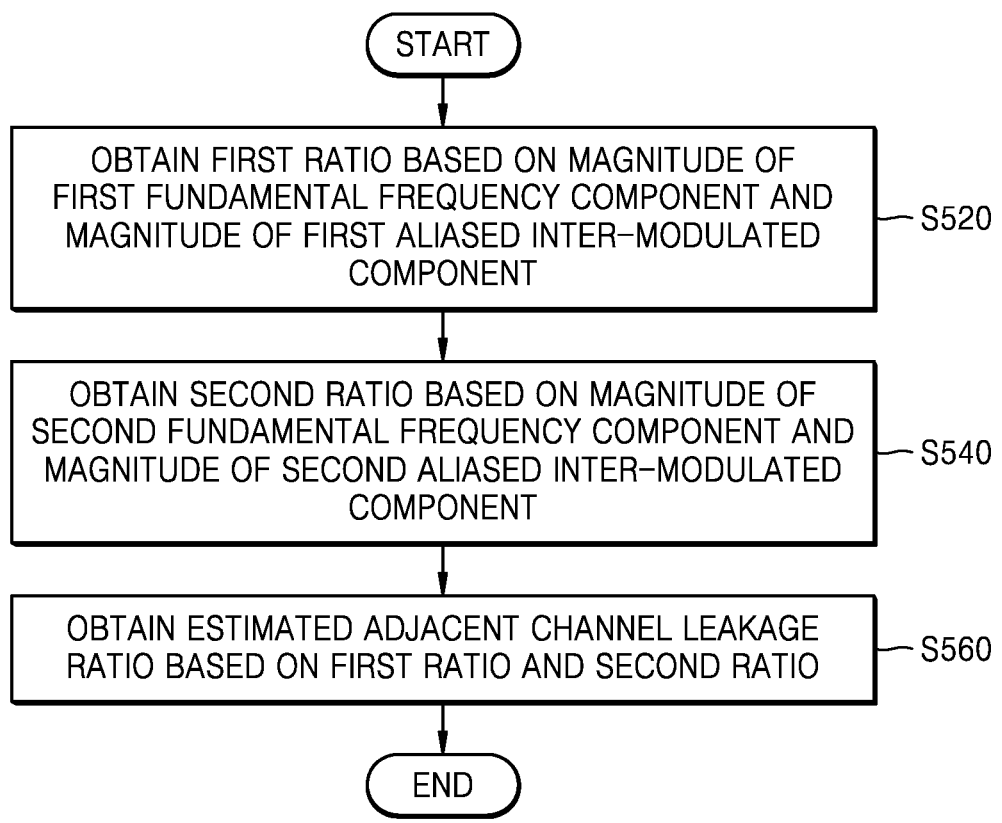
FIGS. 11A and 11B are flowcharts of an envelope delay optimization method according to an example embodiment.
Figure 11B:
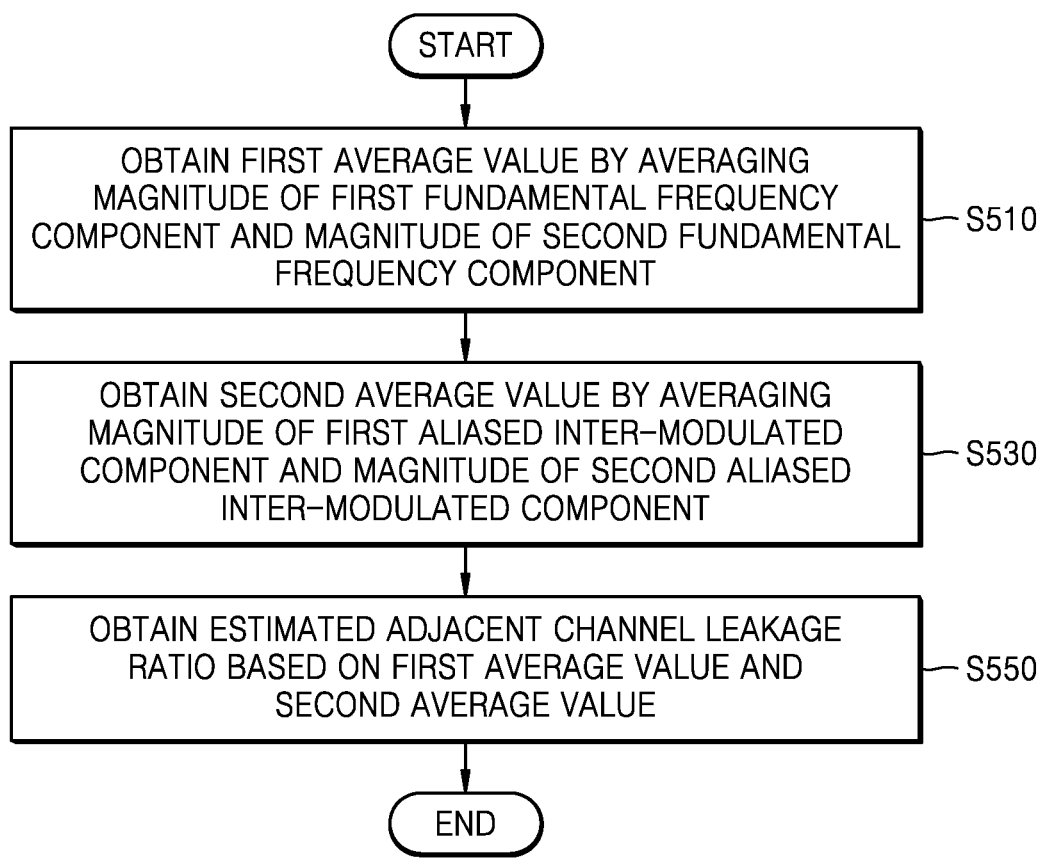

FIGS. 11A and 11B are flowcharts of an envelope delay optimization method according to an example embodiment. In particular, FIGS. 11A and 11B may show detailed flowcharts of operation S320 of FIG. 9. FIGS. 11A and 11B are described with reference to FIGS. 1 and 8.

For convenience of explanation, it is assumed that the test input signal INPUT is a tone signal corresponding to a first frequency and a second frequency. In an example embodiment, the second frequency may correspond to a negative first frequency.

The test output signal OUTPUT may include a first fundamental frequency component corresponding to the first frequency and an inter-modulated component corresponding to the first frequency. In an example embodiment, the inter-modulated component corresponding to the first frequency may be aliased due to a limitation of a sampling rate. In addition, the test output signal OUTPUT may include a second fundamental frequency component corresponding to the second frequency and an inter-modulated component corresponding to the second frequency. In an example embodiment, the inter-modulated component corresponding to the second frequency may be aliased due to a limitation of a sampling rate.

Referring to FIG. 11A, in operation S520, the controller 700 may obtain a first ratio based on the magnitude of the first fundamental frequency component and the magnitude of a first aliased inter-modulated component. For example, the controller 700 may obtain the first ratio by dividing the magnitude of the first fundamental frequency component by the magnitude of the first aliased inter-modulated component.

In operation S540, the controller 700 may obtain a second ratio based on the magnitude of the second fundamental frequency component and the magnitude of a second aliased inter-modulated component. For example, the controller 700 may obtain the second ratio by dividing the magnitude of the second fundamental frequency component by the magnitude of the second aliased inter-modulated component.

In operation S560, the controller 700 may obtain the estimated adjacent channel leakage ratio ACLR_E based on the first ratio and the second ratio. In an example embodiment, the controller 700 may obtain the estimated adjacent channel leakage ratio ACLR_E by averaging the first ratio and the second ratio. Alternatively, in an example embodiment, the controller 700 may select a smaller value of the first ratio and the second ratio as the estimated adjacent channel leakage ratio ACLR_E.

Referring to FIG. 11B, in operation S510, the controller 700 may obtain a first average value by averaging the magnitude of the first fundamental frequency component and the magnitude of the second fundamental frequency component.

In operation S530, the controller 700 may obtain a second average value by averaging the magnitude of the first aliased inter-modulated component and the magnitude of the second aliased inter-modulated component.

In operation S550, the controller 700 may obtain the estimated adjacent channel leakage ratio ACLR_E based on the first average value and the second average value. For example, the controller 700 may obtain the estimated adjacent channel leakage ratio ACLR_E by dividing the first average value by the second average value.

Figure 12A:
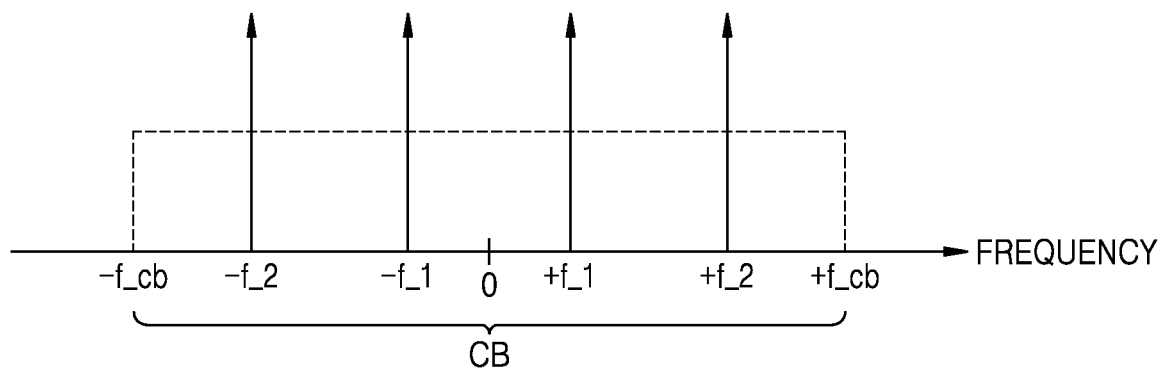
FIGS. 12A and 12B are views illustrating frequency characteristics of test input signals in a test mode according to an example embodiment.
Figure 12B:
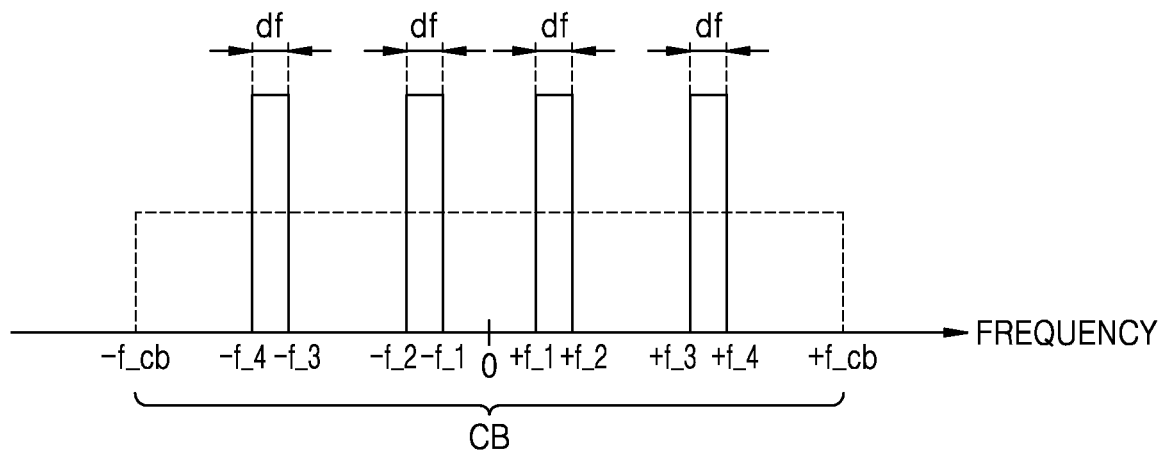

FIGS. 12A and 12B are views illustrating frequency characteristics of test input signals in a test mode according to an example embodiment. FIGS. 12A and 12B illustrate an example of the test input signal INPUT of FIG. 1. FIGS. 12A and 12B are described with reference to FIG. 1.

Referring to FIG. 12A, the test input signal INPUT may be a tone signal corresponding to a plurality of selected frequencies in the channel band CB. For example, the plurality of selected frequencies may include the positive first frequency +f_1, the negative first frequency −f_1, a positive second frequency +f_2, and a negative second frequency −f_2. In other words, the test input signal INPUT may be a tone signal having the positive first frequency +f_1 component, the negative first frequency −f_1 component, a positive second frequency +f_2 component, and a negative second frequency −f_2 component. The first frequency f_1 and the second frequency f_2 may be equal to or less than the channel band frequency f_cb. The channel band frequency f_cb may correspond to half of a bandwidth of the channel band CB, and in an example embodiment, the second frequency f_1 may be the channel band frequency f_cb.

Referring to FIG. 12B, the test input signal INPUT may include a plurality of bandwidth components respectively corresponding to the plurality of selected frequencies in the channel band CB, and each of the plurality of bandwidth components may include a component corresponding to the plurality of frequencies and may correspond to a unit bandwidth signal generated by a resource block in the modem 100. For example, the plurality of selected frequencies may include the positive first frequency +f_1, the negative first frequency −f_1, a positive third frequency +f 3, and a negative third frequency −f 3. The test input signal INPUT includes a component corresponding to the positive first frequency +f_1 and may include a bandwidth component having the bandwidth df, includes a component corresponding to the negative first frequency −f_1 and may include a bandwidth component having the bandwidth df, includes a component corresponding to the positive third frequency +f 3 and may include a bandwidth component having the bandwidth df, and includes a component corresponding to the negative third frequency −f 3 and may include a bandwidth component having the bandwidth df. The bandwidth df may correspond to a unit bandwidth of one resource block in the modem 100.

Figure 13:
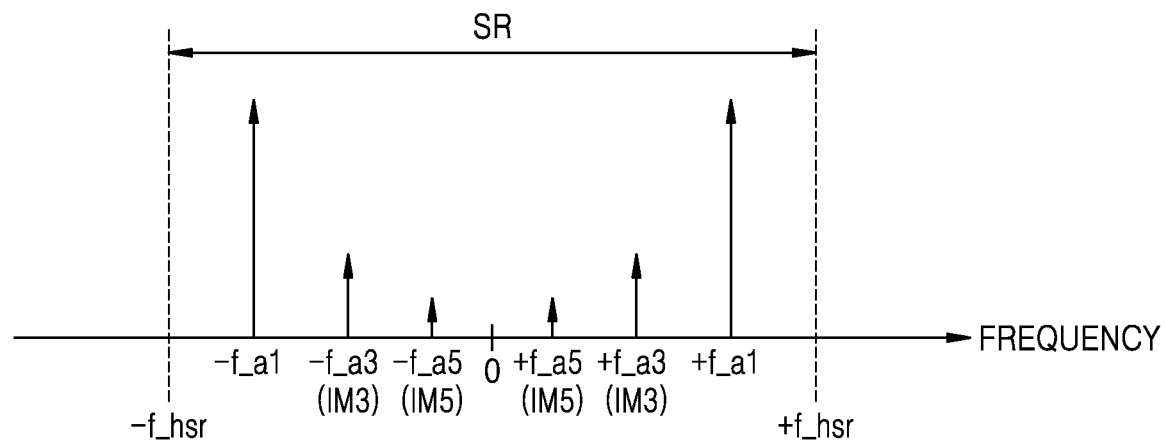
FIG. 13 is a view illustrating frequency characteristics of test output signals in a test mode according to an example embodiment.

FIG. 13 is a view illustrating frequency characteristics of test output signals in a test mode according to an example embodiment. FIG. 13 will be described based on differences from FIG. 7. FIG. 13 is described with reference to FIG. 1.

In particular, FIG. 13 may show a frequency characteristic of the test output signal OUTPUT corresponding to a case where the half sampling frequency f_hsr is less than a first frequency, which is a selected frequency.

In the example embodiment as shown in FIG. 13, the controller 700 may obtain an estimated adjacent channel leakage ratio based on a frequency component corresponding to an aliased first frequency f_a1, wherein the selected frequency is a down-sampled frequency, and aliased inter-modulated components, not a component corresponding to the selected frequency.

Figure 14:
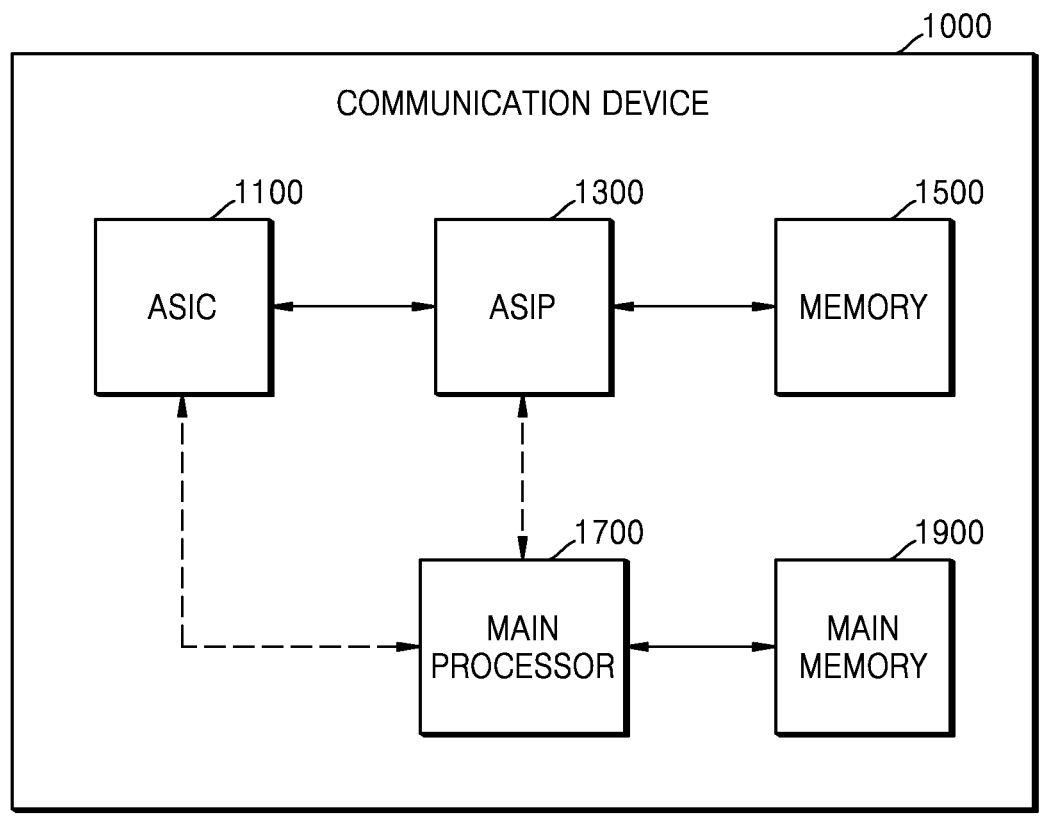
FIG. 14 is a view of a communication device according to an example embodiment.

FIG. 14 is a view of a wireless communication device 1000 according to an example embodiment. As illustrated in FIG. 14, the wireless communication device 1000 may include an application specific integrated circuit (ASIC) 1100, an application specific instruction set processor (ASIP) 1300, a memory 1500, a main processor 1700, and a main memory 1900. At least two of the ASIC 1100, the ASIP 1300, and the main processor 3700 may communicate with each other. Furthermore, at least two of the ASIC 1100, the ASIP 1300, the memory 1500, the main processor 1700, and the main memory 1900 may be included in a single chip.

The ASIP 3300 is an integrated circuit customized for a specific application, and may support an exclusive instruction set for a specific application and may execute an instruction included in the instruction set. The memory 1500 may communicate with the ASIP 1300, and may store a plurality of instructions executed by the ASIP 1300 as a non-transitory storage device. For example, the memory 3500 may include any type of memory accessible by the ASIP 1300 such as random-access memory (RAM), read-only memory (ROM), tape, a magnetic disk, an optical disk, a volatile memory, a nonvolatile memory, and a combination thereof, as non-limiting examples.

The main processor 1700 may control the wireless communication device 1000 by executing a plurality of instructions. For example, the main processor 1700 may control the ASIC 1100 and the ASIP 1300, and may process data received through an MIMO channel or a user's input to the wireless communication device 1000. The main memory 1900 may communicate with the main processor 1700, and may store a plurality of instructions executed by the main memory 1700 as a non-transitory storage device. For example, the main memory 1900 may include any type of memory accessible by the main processor 1700 such as RAM, ROM, tape, a magnetic disk, an optical disk, a volatile memory, a nonvolatile memory, and a combination thereof, as non-limiting examples.

The method of optimizing a delay value of an envelope signal and the method of operating a power amplifier based on a modulated supply voltage according to an example embodiment described above may be performed by at least one of the components included in the wireless communication device 1000 of FIG. 14. In some example embodiments, at least one of operations of the method of optimizing a delay value of an envelope signal and the method of operating a power amplifier based on a modulated supply voltage may be implemented as a plurality of instructions stored in the memory 1500. In some example embodiments, the ASIP 1300 executes a plurality of instructions stored in the memory 1500 to perform at least one of the operations of the methods.

While example embodiments have been particularly shown and described, it will be understood that various changes in form and details may be made therein without departing from the spirit and scope of the following claims.

What is claimed is:
1. A method of optimizing a delay value of an envelope, the method comprising:
converting, in a test mode, a test output signal output from a power amplifier into a frequency domain, wherein the test output signal is generated by the power amplifier according to a test input signal corresponding to a plurality of frequencies;
estimating, in the frequency domain, a plurality of adjacent channel leakage ratios respectively corresponding a plurality of test delay values based on the test output signal in the test mode;
identifying a largest value among the plurality of estimated adjacent channel leakage ratios in the test mode;
selecting a test delay value, from among the plurality of test delay values, that corresponds to the largest value among the plurality of estimated adjacent channel leakage ratios in the test mode; and
providing a supply voltage to the power amplifier based on an envelope signal delayed according to the selected test delay value in a normal mode,
wherein the estimating the plurality of adjacent channel leakage ratios comprises, for each of the plurality of test delay values, estimating a corresponding adjacent channel leakage ratio based on a ratio of a magnitude of a component corresponding to the plurality of frequencies included in the test output signal and a magnitude of an inter-modulated component of the test output signal.

2. The method of claim 1, wherein the estimating the plurality of adjacent channel leakage ratios comprises:
providing the test input signal to a signal transmission path comprising the power amplifier for each of the plurality of test delay values; and
providing a modulated supply voltage to the power amplifier by delaying the envelope signal of the test input signal based on a corresponding test delay value from among the plurality of test delay values.

3. The method of claim 1, wherein the test input signal comprises a tone signal corresponding to the plurality of frequencies.

4. The method of claim 1, wherein the test input signal comprises a plurality of frequency band components, and
wherein each of the plurality of frequency band components comprises components respectively corresponding to the plurality of frequencies, and a component of a unit band generated by one resource block.

5. The method of claim 1, wherein the inter-modulated component comprises any one or any combination of a 3rd-order inter-modulated component and a 5th-order inter-modulated component from a component corresponding to the plurality of frequencies included in the test input signal.

6. The method of claim 1, wherein a half sampling frequency corresponding to half of a sampling rate is less than three times a first frequency included in the plurality of frequencies, and
wherein the estimating the plurality of adjacent channel leakage ratios comprises estimating the corresponding adjacent channel leakage ratio based on a magnitude of a component corresponding to one of the plurality of frequencies included in the test output signal and a magnitude of an aliased 3rd-order inter-modulated component.

7. The method of claim 6, wherein the estimating the plurality of adjacent channel leakage ratios comprises:
obtaining a first aliasing frequency based on the half sampling frequency and the first frequency; and
estimating the plurality of adjacent channel leakage ratios based on a corresponding ratio of the magnitude of the component corresponding to the first frequency included in the test output signal and a magnitude of a component corresponding to the first aliasing frequency.

8. The method of claim 7, wherein the converting the test output signal into a frequency domain comprises performing a fast Fourier transform using the test output signal.

9. The method of claim 7, wherein the obtaining the first aliasing frequency comprises:
multiplying the first frequency by an order of inter-modulation to obtain a multiplication result;
dividing the multiplication result by the half sampling frequency to obtain a division result;
applying a Gaussian function to the division result to obtain a Gaussian function value; and
obtaining the first aliasing frequency by subtracting a value obtained by multiplying the Gaussian function value by the half sampling frequency from the multiplication result.

10. The method of claim 1, wherein the plurality of frequencies comprise a first frequency and a second frequency, and
wherein the estimating the plurality of adjacent channel leakage ratios comprises:
obtaining a first ratio based on a magnitude of a component corresponding to the first frequency included in the test output signal and a magnitude of a first aliased inter-modulated component; and
obtaining a second ratio based on a magnitude of a component corresponding to the second frequency included in the test output signal and a magnitude of a second aliased inter-modulated component; and
selecting the test delay value based on the first ratio and the second ratio.

11. The method of claim 1, wherein the plurality of frequencies comprise a first frequency and a second frequency, and
wherein the estimating the plurality of adjacent channel leakage ratios comprises:
obtaining a first average value by averaging a magnitude of a fundamental frequency component corresponding to the first frequency included in the test output signal and a magnitude of the fundamental frequency component corresponding to the second frequency;
obtaining a second average value by averaging a magnitude of an aliased inter-modulated component corresponding to the first frequency included in the test output signal and a magnitude of the aliased inter-modulated component corresponding to the second frequency; and
selecting the test delay value based on the first average value and the second average value.

12. A method comprising:
converting a test output signal output from a power amplifier into a frequency domain, wherein the test output signal is generated based on an input of a tone signal corresponding to a plurality of selected frequencies that is sampled at a sampling rate;
obtaining a plurality of aliasing frequencies corresponding to an aliased inter-modulated component based on the sampling rate and the plurality of selected frequencies; and
estimating an adjacent channel leakage ratio based on a magnitude of a component corresponding to the plurality of selected frequencies and a magnitude of a component corresponding to the plurality of aliasing frequencies in the converted test output signal, in a frequency domain.

13. The method of claim 12, further comprising:
selecting a test delay value corresponding to a largest value among a plurality of estimated adjacent channel leakage ratios for a plurality of test delay values as an optimized delay value; and
providing a modulated supply voltage to the power amplifier by delaying an envelope signal of a baseband signal based on the optimized delay value in a normal mode.

14. The method of claim 12, wherein a half sampling frequency corresponding to half of the sampling rate is less than three times a first frequency included in the plurality of selected frequencies.

15. The method of claim 14, wherein the obtaining the plurality of aliasing frequencies comprises:
multiplying the first frequency by an order of inter-modulation to obtain a multiplication result;
dividing the multiplication result by the half sampling frequency to obtain a division result;
applying a Gaussian function to the division result to obtain a Gaussian function value; and
obtaining a first aliasing frequency by subtracting a value obtained by multiplying the Gaussian function value by the half sampling frequency from the multiplication result.

16. The method of claim 12, wherein the plurality of selected frequencies comprise a first frequency and a second frequency, and
  wherein the estimating the adjacent channel leakage ratio comprises:
    obtaining a first ratio based on a magnitude of a component corresponding to the first frequency included in the test output signal and a magnitude of a first aliased inter-modulated component;
    obtaining a second ratio based on a magnitude of a component corresponding to the second frequency included in the test output signal and a magnitude of a second aliased inter-modulated component; and
    estimating the adjacent channel leakage ratio based on the first ratio and the second ratio.

17. The method of claim 12, wherein the plurality of selected frequencies comprise a first frequency and a second frequency, and
  wherein the estimating the adjacent channel leakage ratio comprises:
    obtaining a first average value by averaging a magnitude of a fundamental frequency component a corresponding to the first frequency included in the test output signal and a magnitude of the fundamental frequency component corresponding to the second frequency;
    obtaining a second average value by averaging a magnitude of an aliased inter-modulated component corresponding to the first frequency included in the test output signal and a magnitude of the aliased inter-modulated component corresponding to the second frequency; and
    estimating the adjacent channel leakage ratio based on the first average value and the second average value.

18. A communication device comprising:
  a modem configured to generate a tone signal corresponding to a plurality of selected frequencies as a test input signal in a test mode;
  a power amplifier configured to generate a test output signal based on the test input signal transmitted through a signal transmission path in the test mode;
  a voltage modulator configured to, in the test mode, sequentially generate a delayed envelope signal based on each of a plurality of test delay values and sequentially provide a supply voltage to the power amplifier based on the delayed envelope signal, based on each of the plurality of test delay values in the test mode; and
  a controller configured to, in the test mode, convert the test output signal into a frequency domain, estimate, in the frequency domain, an adjacent channel leakage ratio based on a magnitude of a component corresponding to the plurality of selected frequencies included in the test output signal and a magnitude of an inter-modulated component for each of the plurality of test delay values in the test mode, identify a largest value among a plurality of estimated adjacent channel leakage ratios respectively corresponding to the plurality of test delay values in the test mode, select, from among the plurality of test delay values, a test delay value that corresponds to the largest value among the plurality of estimated adjacent channel leakage ratios, and control the voltage modulator based on the test delay value in a normal mode.

19. The communication device of claim 18, wherein a half sampling frequency corresponding to a sampling rate of the power amplifier is less than three times a first frequency included in the plurality of selected frequencies, and
  wherein the controller is further configured to estimate the adjacent channel leakage ratio based on the magnitude of the component corresponding to the plurality of selected frequencies included in the test output signal and a magnitude of an aliased 3rd-order inter-modulated component.

20. The communication device of claim 18, wherein the controller is configured to obtain a plurality of aliasing frequencies based on a half sampling frequency corresponding to a sampling rate of the power amplifier and the plurality of selected frequencies, and estimate the adjacent channel leakage ratio based on a ratio of the magnitude of the component corresponding to the plurality of selected frequencies included in the test output signal and a magnitude of a component corresponding to the plurality of aliasing frequencies.

* * * * *